(12) United States Patent
Gupta (10) Patent No.: US 11,443,776 B2
(45) Date of Patent: Sep. 13, 2022

(54) MEMORY SYSTEM DESIGN FOR SIGNAL INTEGRITY CROSSTALK REDUCTION WITH ASYMMETRY

(71) Applicant: QUALCOMM Incorporated, San Diego, CA (US)

(72) Inventor: Sunil Gupta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 7 days.

(21) Appl. No.: 16/442,208

(22) Filed: Jun. 14, 2019

(65) Prior Publication Data

US 2020/0395051 A1 Dec. 17, 2020

(51) Int. Cl.
*G11C 5/06* (2006.01)
*H01L 25/18* (2006.01)

(52) U.S. Cl.
CPC ............ *G11C 5/063* (2013.01); *H01L 25/18* (2013.01)

(58) Field of Classification Search
CPC ................. G11C 5/063; H01L 25/18
See application file for complete search history.

(56) References Cited

U.S. PATENT DOCUMENTS

| | | | |
|---|---|---|---|
| 8,592,965 B1 * | 11/2013 | Briggs | H01L 23/49575 257/784 |
| 9,038,011 B2 | 5/2015 | Pandey et al. | |
| 9,177,623 B2 | 11/2015 | Pandey et al. | |
| 9,596,749 B2 | 3/2017 | Chen et al. | |
| 2012/0193134 A1 | 8/2012 | Bar-Lev | |
| 2013/0051167 A1 * | 2/2013 | Iwai | G11C 29/785 365/230.06 |
| 2014/0071646 A1 | 3/2014 | Qian et al. | |
| 2014/0252638 A1 | 9/2014 | Pandey et al. | |
| 2018/0005670 A1 * | 1/2018 | Lee | G06F 11/1469 |
| 2018/0096735 A1 * | 4/2018 | Pappu | G11C 29/022 |
| 2018/0331035 A1 * | 11/2018 | Zhang | H01L 23/66 |
| 2019/0098747 A1 | 3/2019 | Ho et al. | |

FOREIGN PATENT DOCUMENTS

WO 2017111855 A1 6/2017

OTHER PUBLICATIONS

International Search Report and Written Opinion—PCT/US2020/037576—ISA/EPO—dated Sep. 25, 2020.

* cited by examiner

*Primary Examiner* — Peter Bradford
(74) *Attorney, Agent, or Firm* — Qualcomm Incorporated/Seyfarth Shaw LLP (57) ABSTRACT

An integrated circuit is described. The integrated circuit (IC) may include a printed circuit board (PCB). The IC may also include a system on chip (SoC) die on the PCB. The IC may further include a memory device coupled to a parallel memory interface of the SoC die. The memory device may be coupled to a parallel memory interface through parallel signal traces arranged in an asymmetric routing. In the asymmetric routing of the parallel signal traces, the signal traces are arranged according to a variable spacing is between the parallel signal traces for a majority portion of the parallel signal traces.

12 Claims, 9 Drawing Sheets

DQ0 Byte (dmi0, dq0 - dq7 bits)
Symmetric-routing of LPDDR signal traces in one Byte in conventional-substrate.

*FIG. 4A*

DQ0 Byte (dmi0, dq0 - dq7 bits)
Asymmetric-routing of LPDDR signal traces in one Byte in new-substrate.

MEMORY SYSTEM DESIGN FOR SIGNAL INTEGRITY CROSSTALK REDUCTION WITH ASYMMETRY

TECHNICAL FIELD

The present disclosure relates generally to integrated communications systems, and more specifically, to a memory system design for signal integrity crosstalk reduction with asymmetry.

BACKGROUND

Electrical connections exist at each level of a system hierarchy. This system hierarchy includes interconnection of active devices from a lowest system level all the way up to system level interconnections at the highest level. For example, interconnect layers can connect different devices together on an integrated circuit. As integrated circuits become more complex, significant numbers of interconnect layers are specified to provide electrical connections between the devices. More recently, the number of interconnect levels for circuitry has substantially increased due to the large number of devices interconnected in modern electronic devices. The increased numbers of interconnect levels for supporting the increased number of devices involve more intricate processes.

These interconnect layers may provide transmission line structures for interconnecting integrated circuit (IC) devices in high frequency circuit designs. For example, high frequency circuit designs may use a transmission line (e.g., a trace) for supporting high speed interfaces. Traditional interconnect traces are fabricated on a printed circuit board (PCB) to support communications between devices on the PCB. For example, a system on chip (SoC) die may communicate with an external memory using a parallel memory interface.

For example, a parallel memory interface may include a low power double data rate (LPDDR) memory interface, configured in a LPDDR parallel interface with single-ended data lanes. A SI (signal integrity) of these parallel traces plays a crucial role in LPDDR performance. Unfortunately, SI is impacted by crosstalk (xtalk), ISI (inter-symbol interference), and reflections, among others sources of signal error. Poor SI reduces an eye-aperture of the SI and, hence, the LPDDR performance. Traditionally, SI channels are designed using conventional substrates that rely on symmetric routing. Symmetric routing leads to higher maximum crosstalk and, thus, poor signal integrity. Signal routing techniques are desired to lower maximum crosstalk and improve SI, while supporting higher performance (e.g., speed).

SUMMARY

An integrated circuit is described. The integrated circuit (IC) may include a printed circuit board (PCB). The IC may also include a system on chip (SoC) die on the PCB. The IC may further include a memory device coupled to a parallel memory interface of the SoC die. The memory device may be coupled to a parallel memory interface through parallel signal traces arranged in an asymmetric routing. In the asymmetric routing of the parallel signal traces, the signal traces are arranged according to a variable spacing is between the parallel signal traces for a majority portion of the parallel signal traces.

An integrated circuit is described. The integrated circuit (IC) may include a parallel memory interface having a parallel signal traces spaced apart based on uneven trace spaces. The spacing of the parallel signal traces may include a trace space between an inner one of the parallel signal traces, greater than a trace space between outer ones of the parallel signal traces.

An integrated circuit is described. The integrated circuit (IC) may include a printed circuit board (PCB). The IC may also include a system on chip (SoC) die on the PCB. The IC may further include an external memory device coupled to a parallel memory interface of the SoC die through the PCB. The PCB may be arranged such that a trace space between inner parallel signal traces of the PCB is greater than a trace space between outer parallel signal traces of the PCB.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Electrical connections exist at each level of a system hierarchy. In particular, interconnect layers connect different devices together on an integrated circuit (IC). As integrated circuits become more complex, more interconnect layers are specified to support electrical connections between the different devices. More recently, the number of interconnect levels for circuitry has substantially increased due to the large number of devices interconnected in modern electronic devices. The increased number of interconnect levels for supporting the increased numbers of devices involve more intricate processes.

These interconnect layers may provide transmission line structures for interconnecting integrated circuit (IC) devices in high frequency circuit designs. For example, high frequency circuit designs may use a transmission line (e.g., a trace) for supporting high speed interfaces. Traditional interconnect traces are fabricated on a printed circuit board (PCB) to support communications between devices on the PCB. For example, a system on chip (SoC) die may communicate with an external memory (e.g., a dynamic random access memory (DRAM)) over parallel traces on the PCB. In particular, the PCB trace may interconnect an SoC package (PKG) to a memory (e.g., DRAM) package on the PCB. Alternatively, the DRAM package may be stacked on the SoC package in a package-on-package (PoP) configuration. These different configurations both rely on a parallel memory interface to support communications.

One type of parallel memory interface is a low power double data rate (LPDDR) memory. An LPDDR may be configured as a parallel interface with single-ended data lanes from SoC to DRAM. SI (signal integrity) of these parallel traces plays a crucial role in LPDDR performance. An SI channel for external memory, as well as PoP systems, is used. Unfortunately, signal integrity is impacted by crosstalk (xtalk), ISI (inter-symbol interference), and reflections, among other sources of signal degradation.

Poor signal integrity generally reduces an eye-aperture of the SI channel and, hence, the LPDDR performance. Traditionally, SI channels are designed using conventional substrates, which rely on symmetric routing. Symmetric routing leads to higher maximum crosstalk and, thus, poor signal integrity. Aspects of the present disclosure provide a redesigned, LPDDR new substrate (PKG and/or PCB), which leads to lower maximum crosstalk and, thus, improved signal integrity and higher performance (e.g., speed).

According to one aspect of the present disclosure, an integrated circuit includes a parallel memory interface having a plurality of parallel traces spaced apart based on uneven trace spaces It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably unless such interchanging would tax credulity.

In the following SoC and external memory device example, symmetric routing leads to higher maximum crosstalk and, thus, poor signal quality. Aspects of the present disclosure provide a redesigned, LPDDR substrate (PKG and/or PCB), which provides lower maximum crosstalk and, thus, improved signal integrity at higher operating frequencies.

According to one aspect of the present disclosure, an integrated circuit includes a parallel memory interface having a plurality of parallel traces spaced apart based on uneven trace spaces. The uneven trace spaces may be arranged with a trace space between inner parallel traces being greater than a trace space between outer parallel traces. For example, a first uneven trace space between the inner parallel traces and a closest trace is greater than a second uneven trace space between any two other of the parallel traces.

Figure 1:
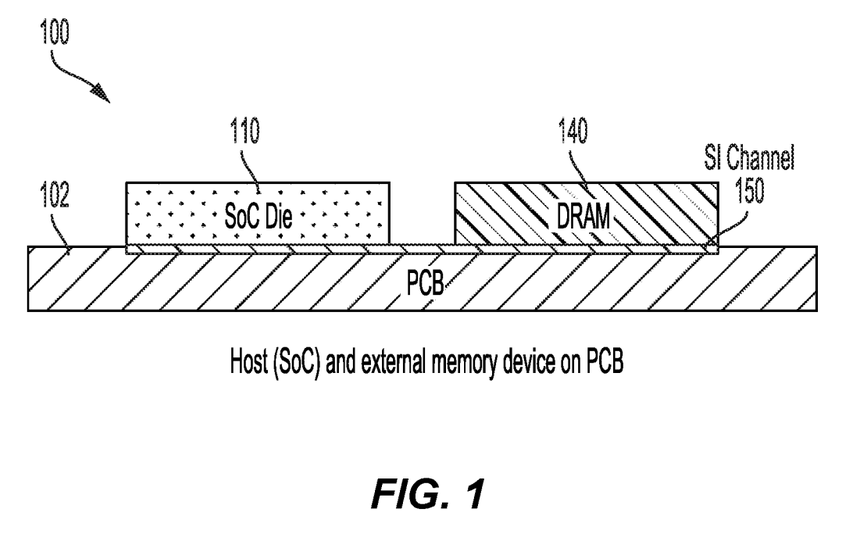
FIG. 1 is a block diagram of a memory sub-system illustrating a host system on chip (SoC) die communicably coupled to an external memory device in accordance with aspects of the present disclosure.

FIG. 1 is a block diagram of a memory sub-system 100 illustrating a host system on chip (SoC) die communicably coupled to an external memory device, in accordance with aspects of the present disclosure. FIG. 1 shows a side view of a low power memory sub-system illustrating an SoC die 110 (e.g., a host SoC die) coupled to an external memory device 140 on a printed circuit board (PCB) 102, in accordance with aspects of the present disclosure. This aspect of the present disclosure applies an asymmetric spacing between PCB traces of a memory link. This example relates to next generation low power double data rate (DDR) (e.g., low power double data rate (LPDDR)) interface implementations in mobile or computing system chipsets. The PCB traces of a signal integrity channel 150 between the SoC die 110 and the external memory device 140 is further illustrated in FIG. 2A.

Figure 2A:
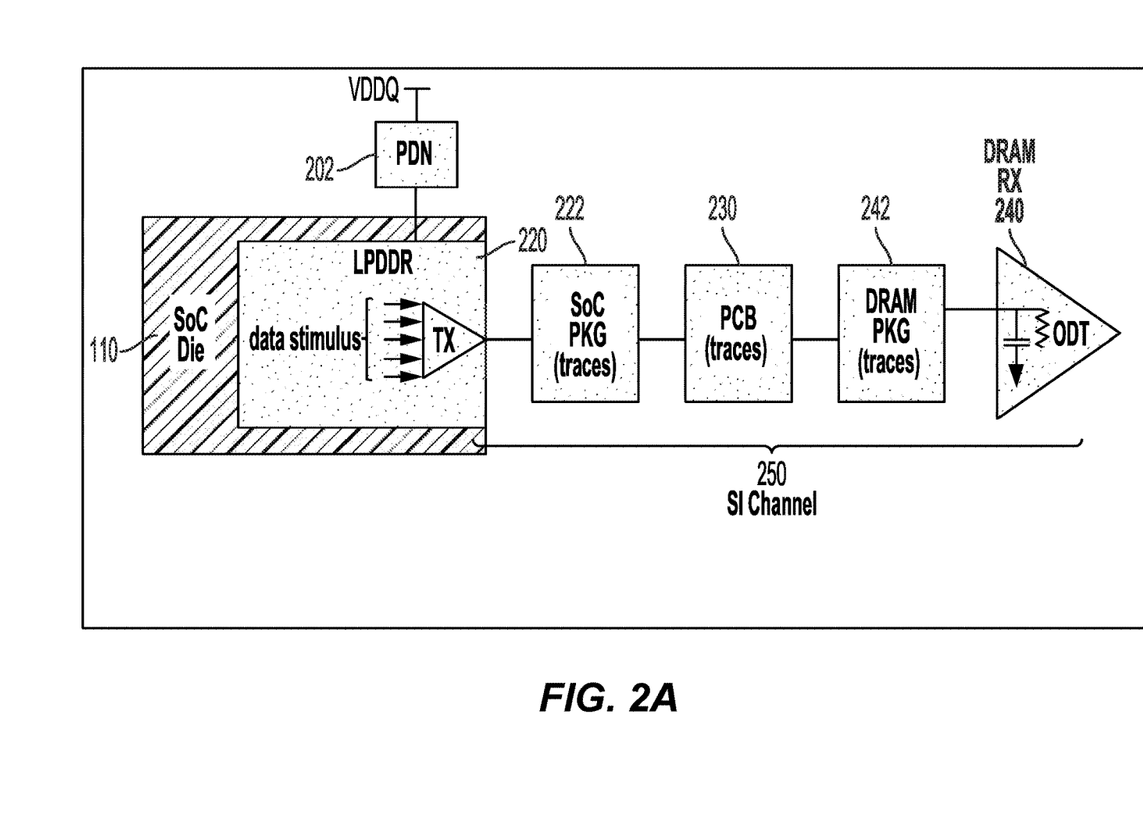
FIGS. 2A and 2B are schematic diagrams further illustrating the memory sub-system of FIG. 1 to show an asymmetric spacing between printed circuit board (PCB) traces of a transmission line structure, according to aspects of the present disclosure.

FIG. 2A is a schematic diagram 200 further illustrating the memory sub-system of FIG. 1, having an asymmetric spacing between printed circuit board (PCB) traces of a transmission line structure, according to aspects of the present disclosure. Representatively, the SoC die 110 includes a parallel memory interface 220 (e.g., an LPDDR (4/4X/5) interface) for communicating between the SoC die 110 and an external memory device (e.g. a dynamic random access memory (DRAM) receiver (RX)) 240. Although shown as a volatile DRAM memory, it should be recognized that the external memory device may be composed of a volatile memory device and/or a non-volatile memory (NVM) device (e.g., negative AND (NAND)/negative OR (NOR) based flash memory). The SoC die 110 is also coupled to a power distribution network (PDN) 202.

In this example of FIG. 2A, the external memory device 140 of FIG. 1 is shown as DRAM RX (e.g., memory RX 240), which is communicably coupled to the parallel memory interface 220 of the SoC die 110. The memory RX 240 is communicably coupled to the parallel memory interface 220 through an SoC package (PKG) trace (e.g., SoC PKG trace 222), a PCB trace 230, and memory (e.g., DRAM) PKG traces 242. In this example, the SoC PKG trace 222, the PCB trace 230, and the memory PKG trace 242 are referred to collectively as a signal-integrity (SI) channel 250 (e.g., a transmission line structure).

Figure 2B:
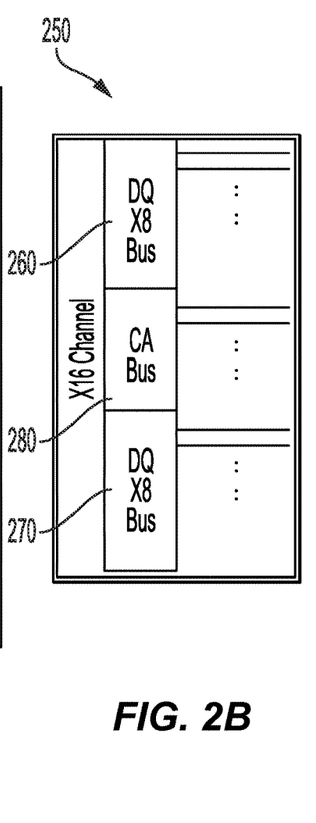

FIG. 2B illustrates an X16 channel configuration of the SI channel 250 (e.g., a transmission line structure). The X16 channel configuration of the SI channel 250 includes a first data (DQ) bus (e.g., the first DQ X8 bus 200 or a first data byte channel), and a second data (DQ) bus 270 (e.g., the second DQ X8 bus 270 or a second data byte channel). The X16 channel configuration of the SI channel 250 also includes a command address (CA) bus 280 between the first DQ X8 bus 260 and the second data (DQ) bus 270, although other channel configurations are contemplated. In this example, the parallel memory interface 220 for communicating between the SoC die 110 and the external memory device 140 (e.g., memory RX 240) runs at a high operating speed (e.g., 2133/3200 MHz input/output (I/O) operating speeds).

In operation, data (or stimulus) from the parallel memory interface 220 travels from the transmitter (TX) of the parallel memory interface 220 through the SoC PKG trace 222 to the PCB trace 230 to the memory PKG trace 242 to the memory RX 240. In this example, the memory RX 240 includes on-die termination (ODT). Hence, the SoC PKG trace 222, the PCB trace 230, and the memory PKG trace 242 are collectively shown as the SI channel 250. Generally, the spacing between the SoC PKG traces 222, the PCB traces 230, and the memory PKG traces 242 is symmetric.

Figure 3A:
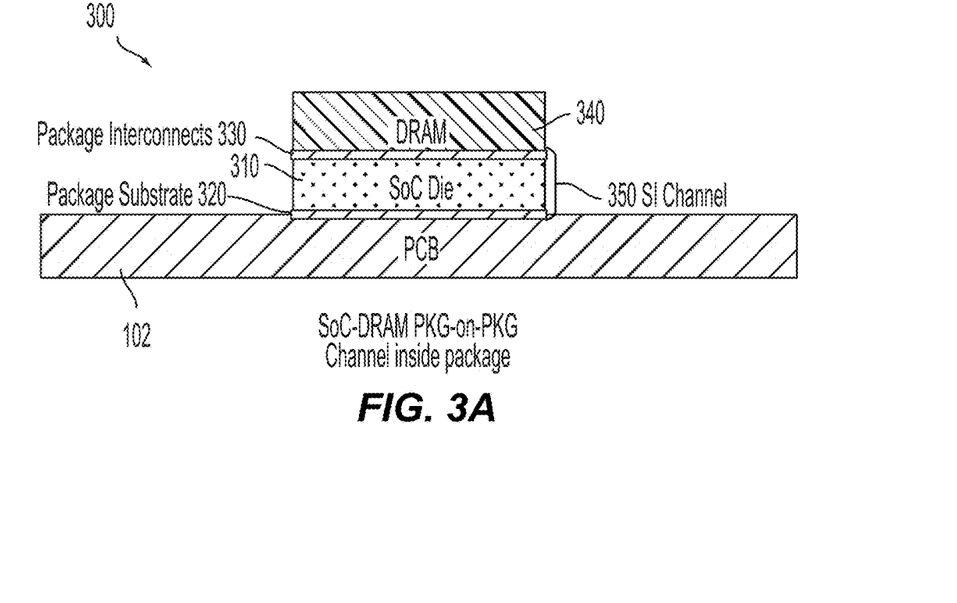
FIGS. 3A and 3B are block diagrams of a memory sub-system, including a memory package stacked on a host system on chip (SoC) die in an SoC-memory package-on-package (PKG-on-PKG) configuration having an internal signal integrity channel, in accordance with aspects of the present disclosure.

FIG. 3A is a block diagram of a memory sub-system 300 illustrating a memory device package 340 DRAM package) stacked on a host system on chip (SoC) die 310 through package interconnects 330 in an SoC-DRAM package-on-package (PKG-on-PKG) configuration having an internal SI channel 350, in accordance with aspects of the present disclosure. FIG. 3A shows a side view of the memory sub-system 300 (e.g., a low power memory sub-system) illustrating the SoC die 310 (e.g., of a host SoC die package), having a stacked memory device package 340 (e.g., a DRAM package) on a package substrate 320 on the PCB 102, in accordance with aspects of the present disclosure. This aspect of the present disclosure applies an asymmetric spacing between traces of the internal SI channel 350. This example also relates to a parallel memory (e.g., LPDDR) interface implementation for a mobile or computing system chipset. The traces of the internal SI channel 350 between the SoC die 310, the package substrate 320, and the memory device package 340 are further illustrated in FIG. 3B. The traces of the internal SI channel 350 of the package substrate 320 and the parallel memory interface 220 are further illustrated in FIGS. 6A and 6B.

Figure 3B:
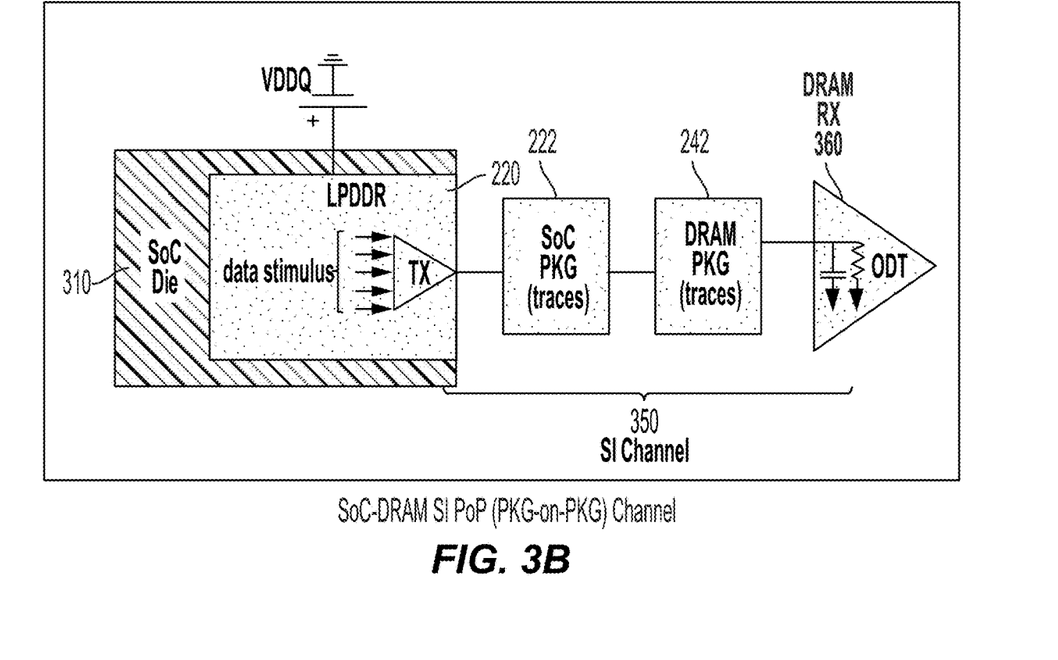

FIG. 3B is a schematic diagram further illustrating the memory sub-system of FIG. 3A to show an asymmetric spacing between traces of an internal transmission line structure, according to aspects of the present disclosure. The SoC die 310 also includes a parallel memory interface 220 (e.g., an LPDDR (4/4X/5) interface) for communicating between the SoC die 310 and the memory device package 340 a dynamic random access memory (DRAM) receiver (RX) 360). Although shown as a volatile DRAM memory, it should be recognized that the external memory device may be composed of a volatile memory device and/or a non-volatile memory (NVM) device (e.g., NAND/NOR-based flash memory).

Generally, the spacing between the SoC PKG traces 222 and the memory PKG traces 242 is symmetric. In particular, conventional wisdom dictates design and fabrication of SI channels using conventional substrates. These conventional substrates rely on symmetric routing (e.g., uniform spacing) between the traces of the internal SI channel 350. Unfortunately, symmetric routing of the traces of the internal SI channel 350 leads to higher maximum crosstalk and, thus, poor SI. As a result, designing the spacing between the traces of the internal SI channel 350 with the conventional symmetric routing generally leads to poor signal integrity.

Referring again to FIG. 2B, the SI channel 250 is configured as an SoC-DRAM SI external channel, outside of the SoC PKG trace 222 and on the PCB trace 230, before reaching the memory PKG traces 242 (e.g., DRAM PKG traces) and, eventually the DRAM RX 240. The internal SI channel 350 in FIGS. 3A and 3B may also be configured using the X16 channel configuration of the SI channel 250 of FIG. 2B. In this configuration, the spacing between the traces of the first DQ X8 bus 260, the CA bus 280, and the second data (DQ) bus 270 is symmetric. Aspects of the present disclosure seek to redesign an LPDDR substrate (e.g., PKG and or PCB) having lower maximum crosstalk and, thus, improved signal integrity performance (e.g., speed).

Figure 4A:
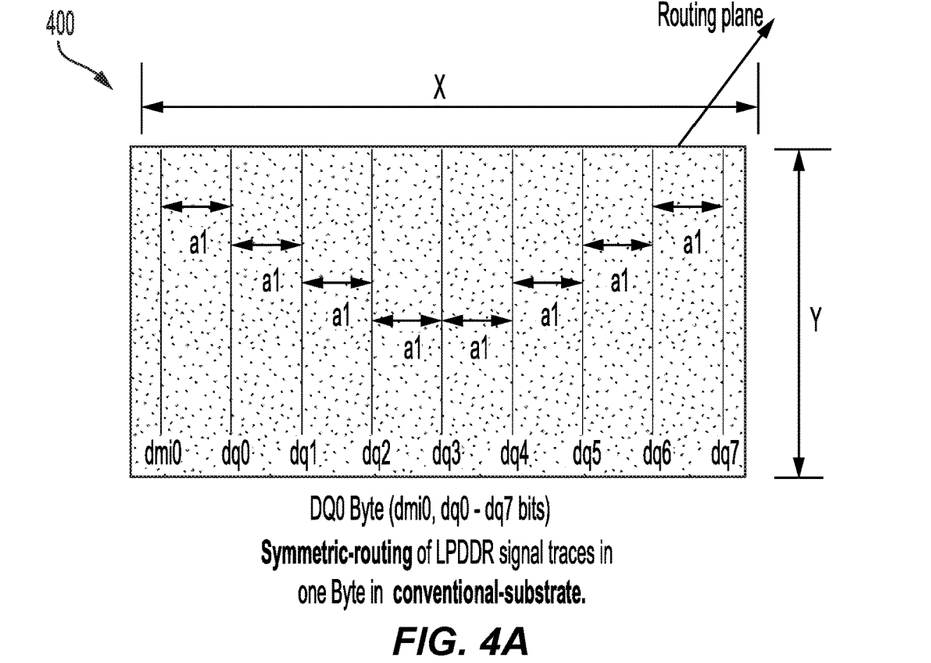
FIG. 4A illustrates one byte in a conventional substrate with symmetric routing of traces shown in a transmission line structure footprint.

FIG. 4A illustrates one byte in a conventional substrate 400 with symmetric routing of traces in a transmission line structure footprint (e.g., X by Y). In this example, signal traces of the conventional substrate 400 include data mask inversion (DMI) and data (dq) bits (e.g., dmi0, dq0-dq7) carried by signal traces of the conventional substrate 400. Representatively, symmetric routing of the conventional substrate means the spacing (e.g., a1) between the traces is uniform. In this symmetric routing configuration of the conventional substrate 400, a maximum crosstalk (Xtalk) among all the bits limits the eye-aperture and data rate of the SI channel. In this configuration, inner traces (e.g., dq2, dq3, dq4) of the conventional substrate 400 experience increased crosstalk, as they are surrounded by more aggressor lines. By contrast, outer traces (e.g., dmi0 and dq7) of the conventional substrate are exposed to less crosstalk due to a decreased number of aggressor lines.

Figure 4B:
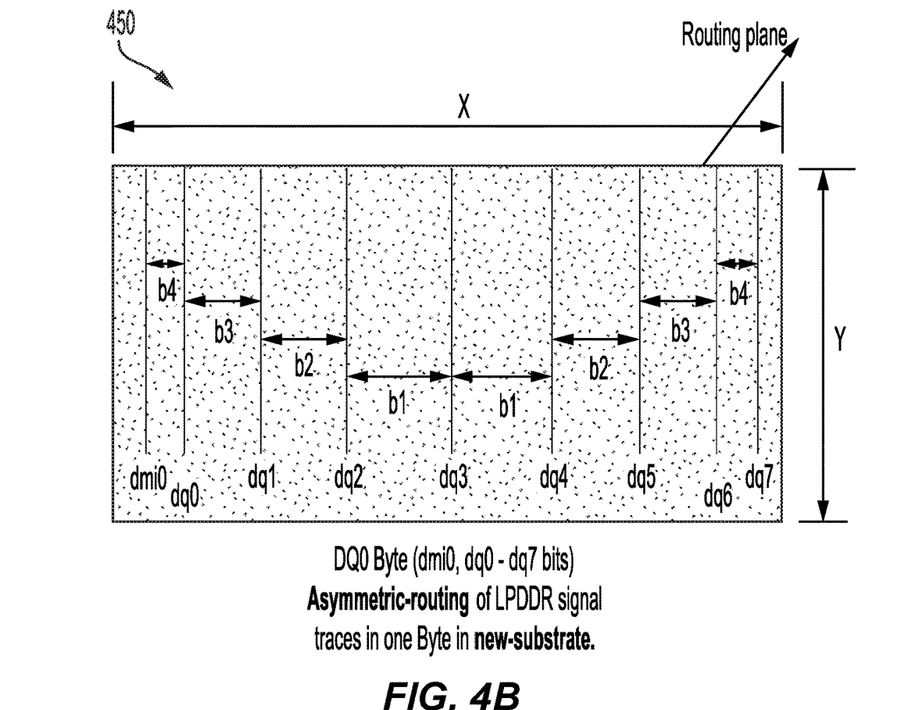
FIG. 4B illustrates one byte in a memory-substrate with asymmetric routing of traces in the same transmission line structure footprint of FIG. 4A, in accordance with aspects of the present disclosure.

FIG. 4B illustrates one byte in a memory-substrate 450 with asymmetric routing of traces in the same transmission line structure footprint of FIG. 4A, in accordance with aspects of the present disclosure. In this example, signal traces of the memory-substrate 450 also include data mask inversion (DMI) and data (dq) bits (e.g., dmi0, dq0-dq7) carried by signal traces of the memory-substrate 450. In contrast to symmetric routing, asymmetric routing of the memory-substrate 450 means the spacing (e.g., b1>b2>b3>b4) between the traces is non-uniform (e.g., uneven trace space). In this asymmetric routing configuration of the memory-substrate 450, a maximum crosstalk (Xtalk) among all the bits is reduced. In this example, a smallest uneven trace space (e.g., b4) equals a distance between the furthest parallel signal trace (e.g., dmi0/dq7) from a center (e.g., dq3) of the parallel memory interface and a next furthest parallel signal trace (e.g., dq0/dq6).

According to aspects of the present disclosure, the reduced crosstalk provided by the asymmetric routing of the memory-substrate 450 improves the eye-aperture and data rate of the SI channel. In this configuration, increased spacing between inner traces of the memory-substrate 450 experience decreased crosstalk by increasing separation from aggressor lines. By contrast, outer traces of the memory-substrate 450, which are exposed to less crosstalk, include a reduced trace spacing due to a decreased number of aggressor lines. As shown in FIGS. 4A and 4B, trace widths and a characteristic impedance (ZO) is the same for all traces of the conventional substrate 400 and the memory-substrate 450.

Figure 5A:
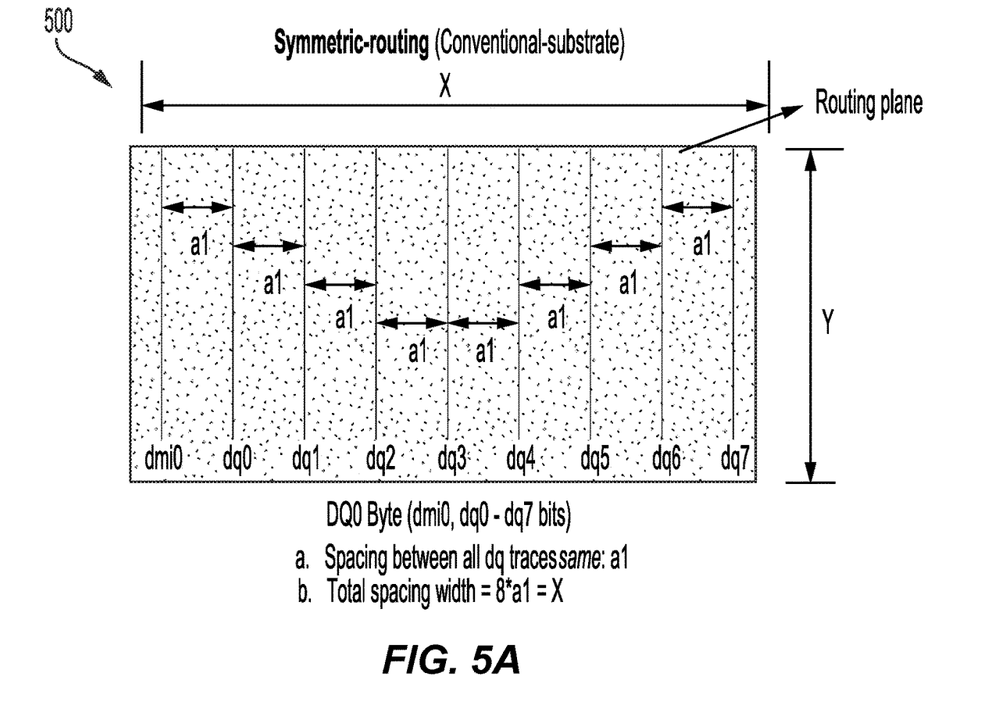
FIGS. 5A and 5B illustrate one byte in a conventional substrate with symmetric routing of traces in the transmission line structure footprint of FIG. 4A.
Figure 5B:
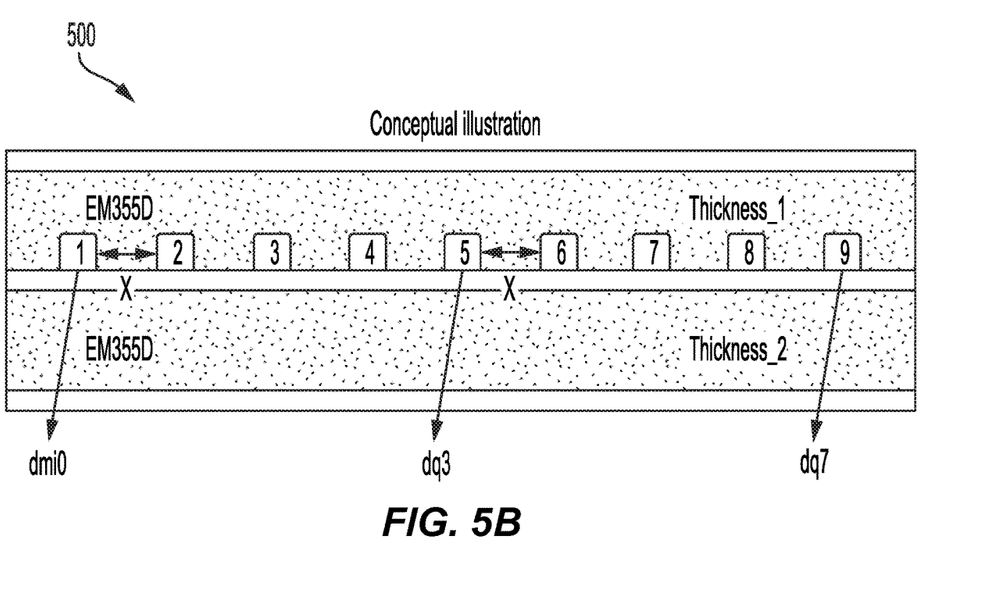

FIGS. 5A and 5B illustrate one byte in a conventional substrate 500 with symmetric routing of traces in the transmission line structure footprint of FIG. 4A. As shown in FIG. 5B, signal traces (1 (dmi0), 2, ..., 5 (dq3), ..., 9(dq7)) of the conventional substrate 500 following a symmetric routing, in which the spacing (e.g., a1) between the traces is uniform. In this symmetric routing configuration of the conventional substrate 500, a total spacing width (X) of the transmission line foot is a multiple of the spacing a1 (e.g., X=8*a1).

Figure 6A:
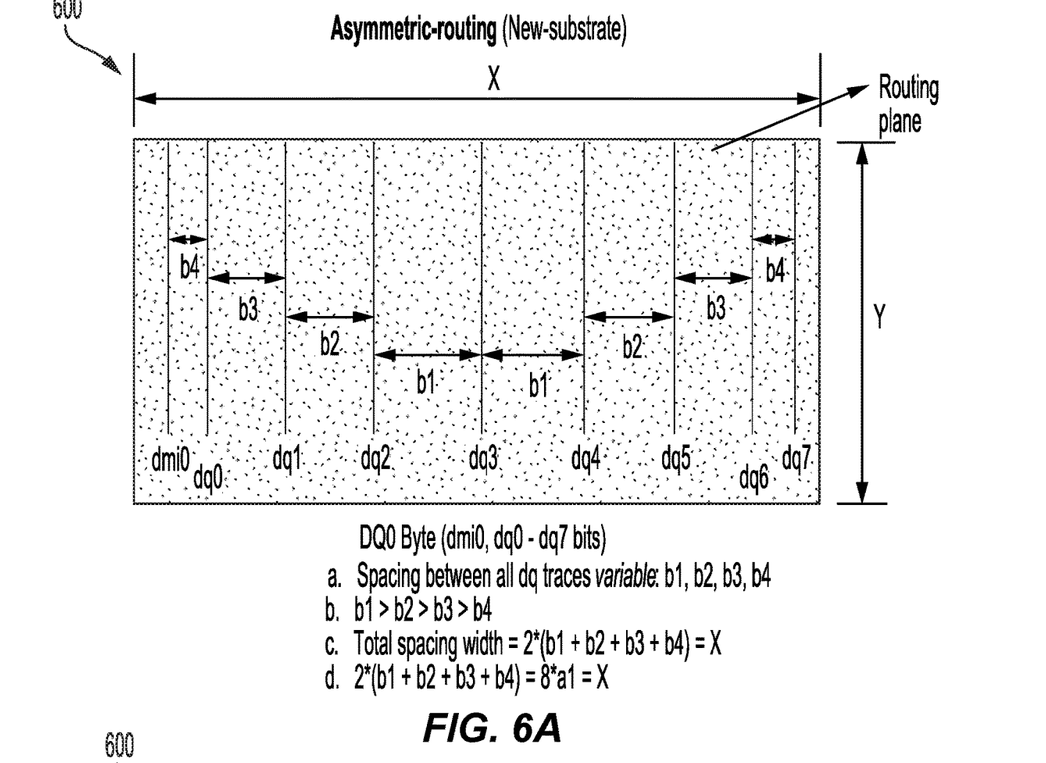
FIGS. 6A and 6B illustrate one byte in a memory-substrate with asymmetric routing of traces in the same transmission line structure footprint of FIG. 4A, in accordance with aspects of the present disclosure.
Figure 6B:
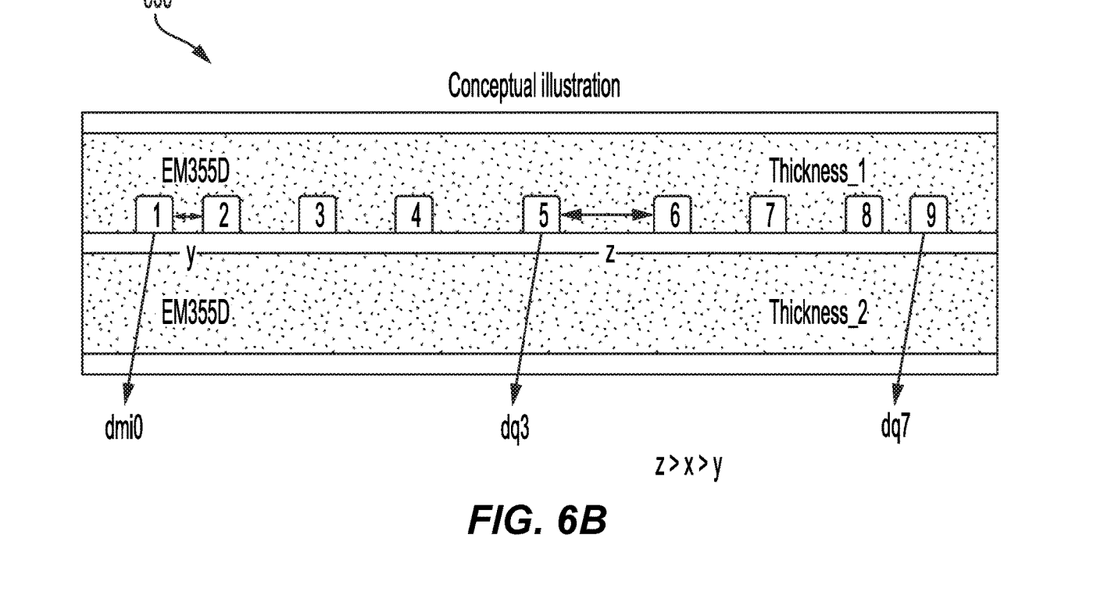

FIGS. 6A and 6B illustrate one byte in a memory-substrate 600 with asymmetric routing of traces in the same transmission line structure footprint of FIG. 4A, in accordance with aspects of the present disclosure. In this example, signal traces of the memory-substrate 600 also include data mask inversion (DMI) and data (dq) bits (e.g., 1 (dmi0), 2, ..., 5 (dq3), ..., 9 (dq7)) carried by signal traces of the memory-substrate 600. In contrast to symmetric routing, asymmetric routing of the memory-substrate 600 means the spacing (e.g., b1>b2>b3>b4) between the traces is variable (e.g., variable space provided between the parallel signal traces of a longest leg). In this asymmetric routing configuration of the memory-substrate 600, a total spacing width (X) of the transmission line foot is a sum of the variable spacing (e.g., X=2*(b1+b2+b3+b4)=8*a). In this example, a space (z) between traces 5 and 6 is greater than a space (y) between traces 1 and 2. In addition, the space (z) of the memory-substrate is greater than a space (x) between traces 5 and 6 of the conventional substrate 500 (e.g., z>x>y). That is, the space (z) is same as b1, the space (y) is same as b4 and space (x) is same as a1. It should recognized, in the space (x), x is a small x, which should not to be confused with capital X which is the total spacing width.

Figure 7A:
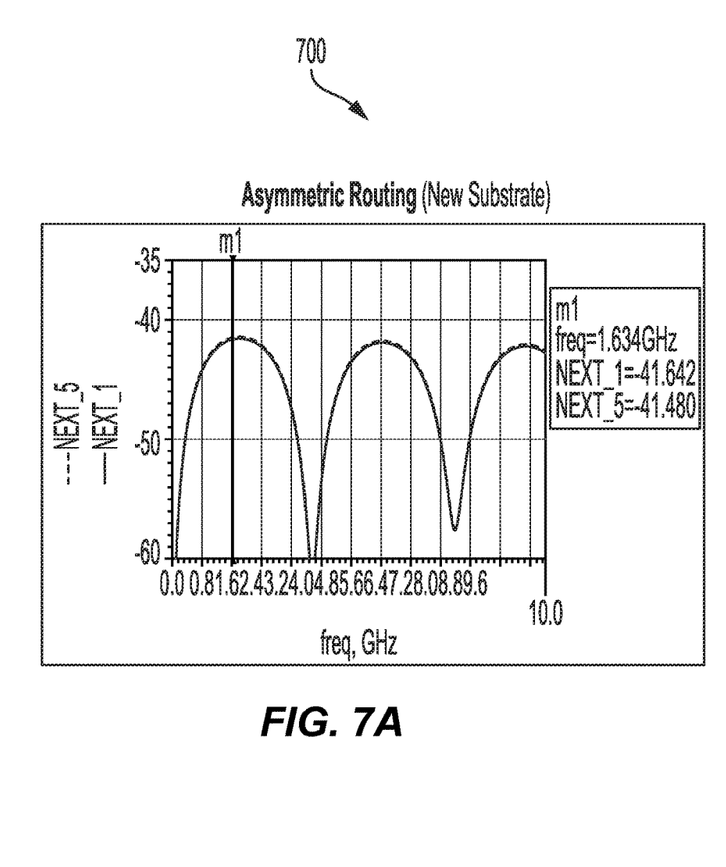
FIGS. 7A and 7B are graphs illustrating capacitive and inductive coupling to adjacent traces due to conventional, symmetric routing and asymmetric routing, according to aspects of the present disclosure.
Figure 7B:
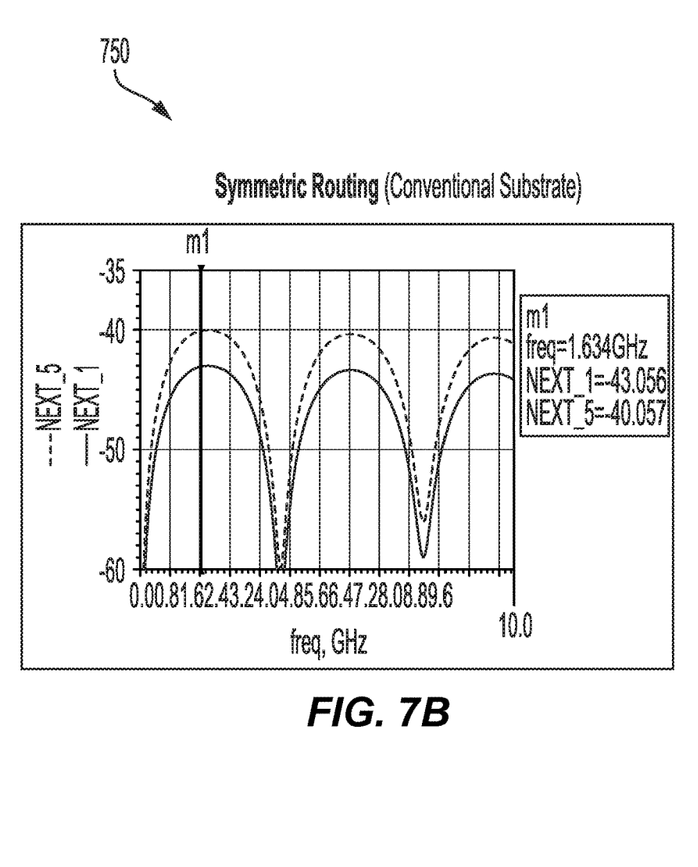

FIGS. 7A and 7B are graphs illustrating capacitive and inductive coupling to adjacent traces due to conventional, symmetric routing and asymmetric routing, according to aspects of the present disclosure. In FIGS. 7A and 7B, a NEXT_1 signal corresponds to crosstalk experienced by corner traces (e.g., dmi0), and a NEXT_5 signal corresponds to crosstalk experienced by middle traces (e.g., dq3). As shown by FIGS. 7A and 7B, a delta between inductive/capacity coupled experienced traces formed using asymmetric routing and symmetric routing is significant. For example, the delta capacity/inductive coupling shown by the NEXT_1 signal for the corner traces (e.g., dmi0) is significant (=−41.642−(−43.056)=1.416 dB). Similarly, a delta between capacity/inductive coupling shown by the NEXT_5 signal for the middle traces (e.g., dq3) is significant (=−41.480−(−40.057)=−1.423 dB).

In FIG. 7A, a capacity/inductive coupling graph 700 is shown for the asymmetric routing shown in FIGS. 6A and 6B, according to aspects of the present disclosure. The capacity/inductive coupling graph 700 illustrates asymmetric routing (e.g., variable spacing) results in even capacitive and inductive coupling between adjacent traces. As shown by comparing the NEXT_1 signal and NEXT_5 signal, asymmetric routing reduces the maximum limiting crosstalk exerted on middle dq3 trace. That is, the crosstalk exerted on the middle trace (e.g., dq3) is significantly reduced (e.g., by 1.42 dB).

In addition, the even capacity and inductive coupling between adjacent traces significantly increases the crosstalk (e.g., 1.416 dB) exerted on corner traces (e.g., dmi0). Overall, the maximum limiting crosstalk of the full byte of the asymmetric routing is substantially reduced (e.g., by 1.42 dB). This reduction of the maximum limiting crosstalk improves signal integrity and system performance. It should be recognized that crosstalk is dependent upon spacing, but is not a linear function of spacing.

FIG. 7B shows a capacity/inductive coupling graph 750 for the conventional symmetric routing shown in FIGS. 5A and 5B. The capacity/inductive coupling graph 750 illustrates symmetric routing (e.g., uniform spacing) results in uneven capacitive and inductive coupling between adjacent traces and, thus, produces uneven crosstalk on traces. As shown by comparing the NEXT_1 signal and NEXT_5 signal, symmetric routing increases the maximum crosstalk exerted on middle dq3 trace. This maximum crosstalk is due to coupling effects exerted on the middle trace (e.g., dq3) from both sides. This maximum crosstalk limits the overall eye-aperture/data rate for transmitting a byte using symmetric routing. By contrast, corner traces (e.g., dmi0 and dq7) experience minimum crosstalk because corner traces have just one adjacent trace (e.g. dq0 and dq6).

A redesigned memory-substrate using an asymmetric routing, according to aspects of the present disclosure, results in lower maximum crosstalk. This lower maximum crosstalk improves the signal integrity and translates into larger eye-apertures of transmission line structure of the overall system. For example, larger eye-apertures provide extra timing margins, which enables higher performance (e.g., speed) of a parallel memory interface (e.g., LPDDR). In addition, larger eye-apertures provide extra timing margins, which enables reduction of expensive on-die de-capacitance (decap) for the same performance.

Aspects of the present disclosure reduce worst case crosstalk in the same footprint (e.g., area) leading to overall higher performance (e.g., speed). These techniques are applicable to current LPDDR4/4X/5 memory interfaces as well as future products. Although described with reference to LPDDR, aspects of the present disclosure are applicable to other parallel interfaces such as DDR and graphics DDR (GDDR). Furthermore, aspects of the present disclosure are not limited to PCB/PKG routing, but may be extended to on-die routing.

Figure 8:
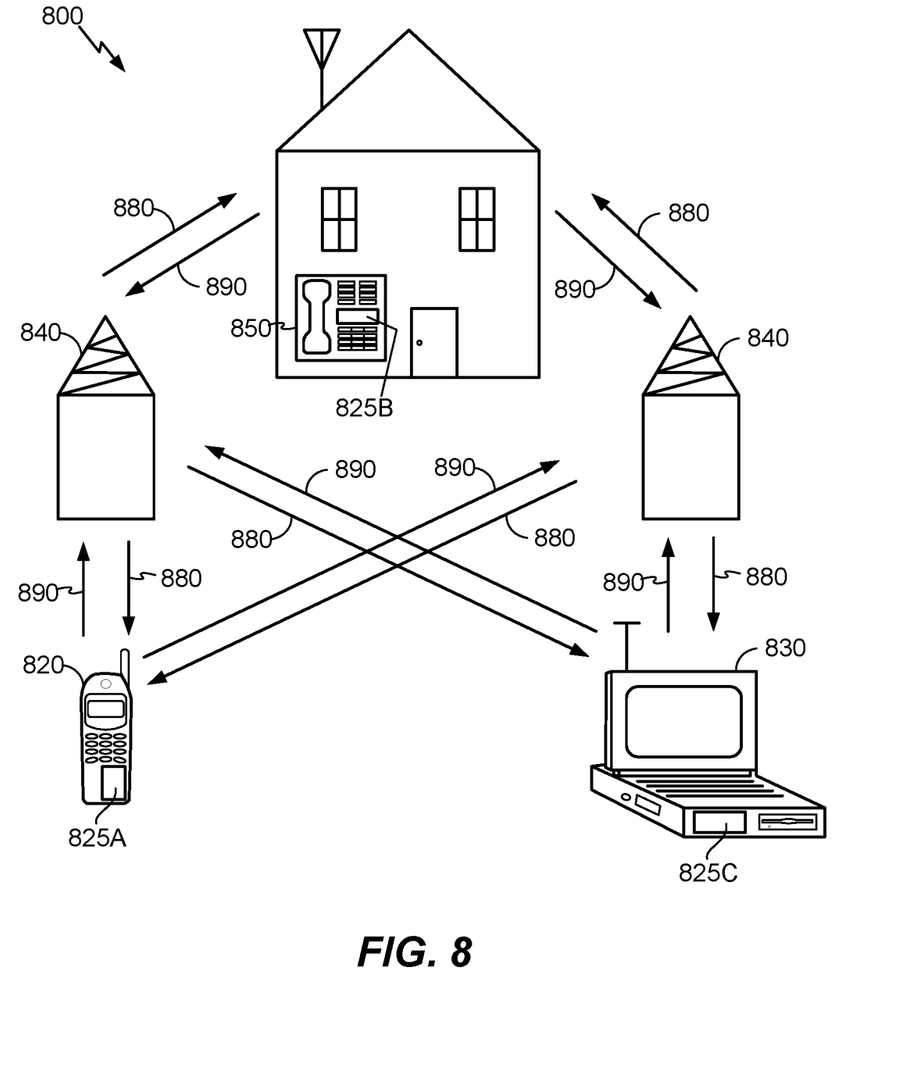
FIG. 8 is a block diagram showing an exemplary wireless communications system in which a configuration of the disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include IC devices 825A, 825C, and 825B that include the disclosed asymmetric-routing of signal traces. It will be recognized that other devices may also include the disclosed improved signal trace spacing, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, an automotive electronic system, or other device that stores or retrieves data or computer instructions, or combinations thereof. Although FIG. 8 illustrates remote units according to aspects of the present disclosure, the disclosure is not limited to these exemplary illustrated units. Aspects of the present disclosure may be suitably employed in many devices, which include the disclosed improved signal trace spacing.

Figure 9:
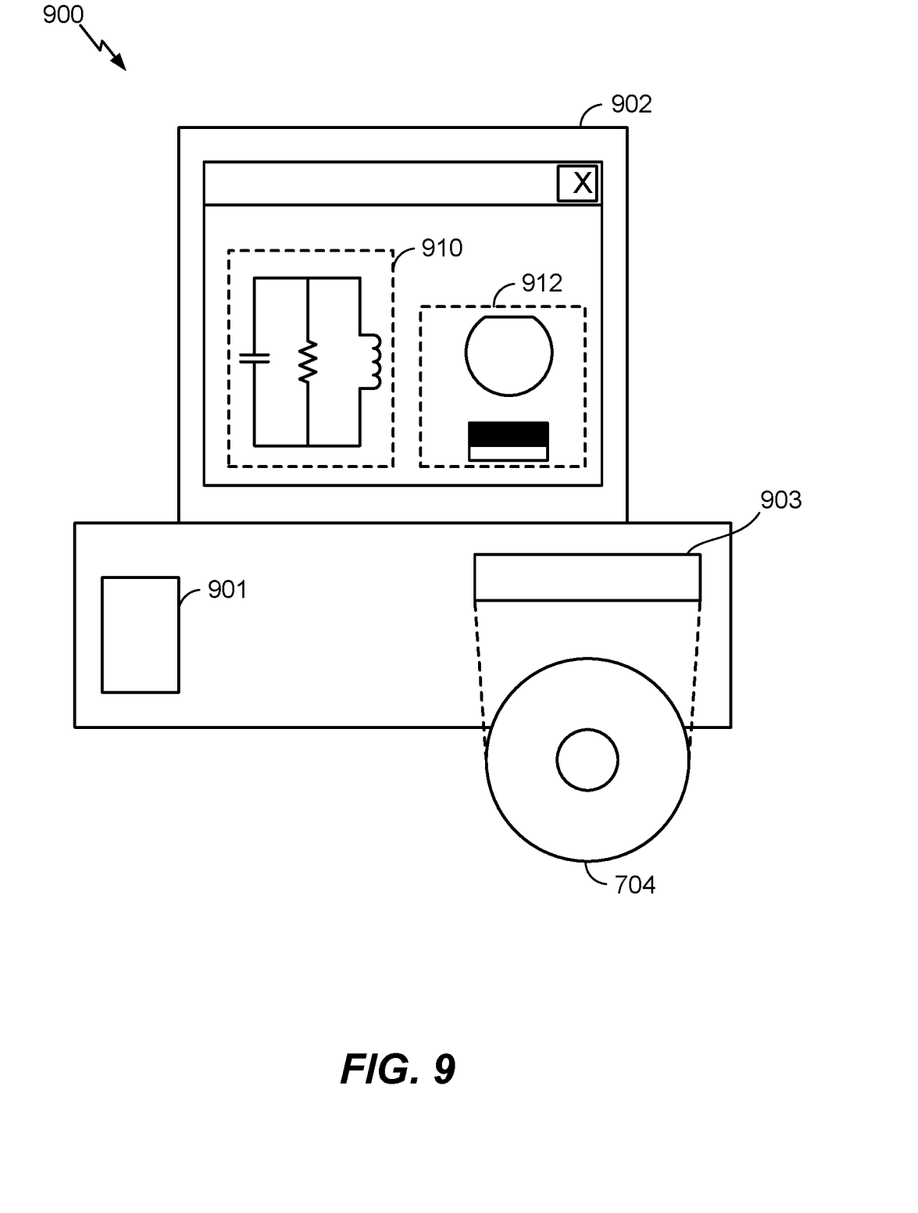
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the improved signal trace spacing disclosed above. A design workstation 900 includes a hard disk 901 containing operating system software, support files, and design software such as Cadence or OrCAD. The design workstation 900 also includes a display 902 to facilitate design of a circuit 910 or a signal trace 912. A storage medium 904 is provided for tangibly storing the design of the circuit 910 or the signal trace 912. The design of the circuit 910 or the signal trace 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the signal trace 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk, and Blu-ray disc, where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray disc, where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit, comprising:
a printed circuit board (PCB);
a package substrate interconnected on the PCB, the package substrate comprising parallel signal traces arranged in an asymmetric routing;
a system on chip (SoC) die interconnected on the package substrate, the SoC die comprising a parallel memory interface coupled to the parallel signal traces of the package substrate through package interconnects; and
a memory device package on the SoC die and coupled to the parallel memory interface of the SoC die through the parallel signal traces arranged in the asymmetric routing of the package substrate, in which a variable spacing is provided between the parallel signal traces for a majority portion of the parallel signal traces of a longest leg of an internal signal integrity channel.

2. The integrated circuit of claim 1, in which a trace space between an inner one of the parallel signal traces is greater than the trace space between an outer one of the parallel signal traces.

3. The integrated circuit of claim 2, in which a first uneven trace space between the inner one of parallel signal traces and a closest trace is greater than a second uneven trace space between any two other of the parallel signal traces.

4. The integrated circuit of claim 1, in which a smallest uneven trace space equals a distance between a furthest parallel signal trace from a center of the parallel memory interface and the next furthest parallel signal trace.

5. The integrated circuit of claim 1, in which the parallel memory interface comprises a plurality of channels, and each channel comprises a first data byte channel and a second data byte channel, the first data byte channel and the second data byte channel comprising uneven trace spaces b1, b2, b3, and b4, in which b1>b2>b3>b4.

6. The integrated circuit of claim 1, in which the parallel memory interface comprises a low power double data rate (LPDDR) memory interface.

7. The integrated circuit of claim 1, in which the memory device package comprises a volatile memory device and/or a non-volatile memory (NVM) device.

8. The integrated circuit of claim 1, integrated into a mobile phone, a set top box, a music player, a video player, an entertainment unit, a navigation device, a computer, a hand-held personal communications systems (PCS) unit, a portable data unit, a fixed location data unit, and/or an automotive electronic system.

9. An integrated circuit, comprising:
a package substrate comprising parallel signal traces arranged in an asymmetric routing;
a die interconnected on the package substrate and having a parallel memory interface coupled to the plurality of parallel signal traces of the package substrate through package interconnects, in which the parallel signal traces of the package substrate are spaced apart based on uneven trace spaces,
in which a trace space between inner ones of the parallel signal traces is greater than a trace space between outer ones of the parallel signal traces for a majority portion of the parallel signal traces of a longest leg of an internal signal integrity channel; and
a memory device package stacked on the die and coupled to the parallel memory interface of the die through the asymmetric routing of the package substrate.

10. The integrated circuit of claim 9, in which a first uneven trace space between the inner ones of the plurality of parallel signal traces and a closest signal trace is greater than a second uneven trace space between any two other of the plurality of parallel signal traces.

11. The integrated circuit of claim 9, in which a smallest uneven trace space b4 equals a distance between a furthest one of the plurality of parallel signal trace from a center of the parallel memory interface and a next furthest one of the plurality of parallel signal traces.

12. The integrated circuit of claim 9, in which the parallel memory interface comprises a plurality of channels, and each channel comprises a first data byte channel and a second data byte channel, the first data byte channel and the second data byte channel comprising uneven trace spaces b1, b2, b3, and b4, in which b1>b2>b3>b4.

* * * * *